US009098666B2

(12) United States Patent  
Samadi et al.

(10) Patent No.: US 9,098,666 B2  
(45) Date of Patent: Aug. 4, 2015

(54) CLOCK DISTRIBUTION NETWORK FOR 3D INTEGRATED CIRCUIT

(71) Applicant: QUALCOMM Incorporated, San Diego, CA (US)

(72) Inventors: Kambiz Samadi, San Diego, CA (US); Shreepad A. Panth, Atlanta, GA (US); Jing Xie, University Park, PA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 74 days.

(21) Appl. No.: 13/792,486

(22) Filed: Mar. 11, 2013

(65) Prior Publication Data

US 2014/0145347 A1 May 29, 2014

Related U.S. Application Data

(60) Provisional application No. 61/730,755, filed on Nov. 28, 2012, provisional application No. 61/730,767, filed on Nov. 28, 2012.

(51) Int. Cl.  
*G06F 17/50* (2006.01)  
*H01L 23/522* (2006.01)  
(Continued)

(52) U.S. Cl.  
CPC .............. *G06F 17/5072* (2013.01); *G06F 1/32* (2013.01); *G06F 17/5068* (2013.01); *G11C 5/14* (2013.01);  
(Continued)

(58) Field of Classification Search  
CPC .............. G06F 17/5045; G06F 17/505; G06F 17/5068; G06F 17/5072; G06F 17/5077

USPC ......... 716/100, 104, 110, 114, 118–120, 136, 716/130, 132, 134  
See application file for complete search history.

(56) References Cited

U.S. PATENT DOCUMENTS 5,606,186 A 2/1997 Noda  
5,636,125 A 6/1997 Rostoker et al.  
(Continued)

FOREIGN PATENT DOCUMENTS

EP 1432032 A2 6/2004  
EP 2551898 A1 1/2013  
(Continued)

OTHER PUBLICATIONS

Lin, Chang-Tzu et al., "CAD reference flow for 3d Via-Last Integrated Circuits". 2010, IEEE, pp. 187-192.*  
(Continued)

*Primary Examiner* — Stacy Whitmore  
(74) *Attorney, Agent, or Firm* — Nicholas J. Pauley; Peter Michael Kamarchik; Paul Holdaway

(57) ABSTRACT

Exemplary embodiments of the invention are directed to systems and method for designing a clock distribution network for an integrated circuit. The embodiments identify critical sources of clock skew, tightly control the timing of the clock and build that timing into the overall clock distribution network and integrated circuit design. The disclosed embodiments separate the clock distribution network (CDN), i.e., clock generation circuitry, wiring, buffering and registers, from the rest of the logic to improve the clock tree design and reduce the area footprint. In one embodiment, the CDN is separated to a separate tier of a 3D integrated circuit, and the CDN is connected to the logic tier(s) via high-density inter-tier vias. The embodiments are particularly advantageous for implementation with monolithic 3D integrated circuits.

24 Claims, 5 Drawing Sheets

(51) Int. Cl.
*G11C 5/14* (2006.01)
*G06F 1/32* (2006.01)

(52) U.S. Cl.
CPC .......... *H01L 23/5226* (2013.01); *G06F 17/505* (2013.01); *G06F 17/5045* (2013.01); *G06F 17/5077* (2013.01); *G06F 2217/62* (2013.01); *H01L 2924/0002* (2013.01)

(56) References Cited

U.S. PATENT DOCUMENTS

| | | | |
|---|---|---|---|
| 5,724,557 A * | 3/1998 | McBean, Sr. | 716/113 |
| 6,040,203 A | 3/2000 | Bozso et al. | |
| 6,125,217 A | 9/2000 | Paniccia et al. | |
| 6,260,182 B1 | 7/2001 | Mohan et al. | |
| 6,295,636 B1 * | 9/2001 | Dupenloup | 716/103 |
| 6,305,001 B1 | 10/2001 | Graef | |
| 6,374,200 B1 | 4/2002 | Nakagawa | |
| 6,448,168 B1 | 9/2002 | Rao et al. | |
| 6,627,985 B2 | 9/2003 | Huppenthal et al. | |
| 6,727,530 B1 | 4/2004 | Feng et al. | |
| 6,754,877 B1 * | 6/2004 | Srinivasan | 716/114 |
| 6,834,380 B2 | 12/2004 | Khazei | |
| 6,846,703 B2 | 1/2005 | Shimoda et al. | |
| 6,965,527 B2 | 11/2005 | Fasoli et al. | |
| 6,979,630 B2 | 12/2005 | Walitzki | |
| 7,107,200 B1 * | 9/2006 | Korobkov | 703/13 |
| 7,173,327 B2 | 2/2007 | Siniaguine | |
| 7,209,378 B2 | 4/2007 | Nejad et al. | |
| 7,280,397 B2 | 10/2007 | Scheuerlein | |
| 7,288,418 B2 | 10/2007 | Barge et al. | |
| 7,298,641 B2 | 11/2007 | Madurawe et al. | |
| 7,356,781 B2 | 4/2008 | Koeder et al. | |
| 7,459,716 B2 | 12/2008 | Toda et al. | |
| 7,546,571 B2 | 6/2009 | Mankin et al. | |
| 7,579,654 B2 | 8/2009 | Couillard et al. | |
| 7,622,955 B2 | 11/2009 | Vilangudipitchai et al. | |
| 7,653,884 B2 | 1/2010 | Furnish et al. | |
| 7,663,620 B2 | 2/2010 | Robertson et al. | |
| 7,669,152 B1 | 2/2010 | Tcherniaev et al. | |
| 7,796,092 B2 | 9/2010 | Holly et al. | |
| 7,877,719 B2 * | 1/2011 | He | 716/114 |
| 7,964,916 B2 | 6/2011 | Or-Bach et al. | |
| 7,969,193 B1 | 6/2011 | Wu et al. | |
| 7,989,226 B2 | 8/2011 | Peng | |
| 8,006,212 B2 | 8/2011 | Sinha et al. | |
| 8,026,521 B1 | 9/2011 | Or-Bach et al. | |
| 8,046,727 B2 | 10/2011 | Solomon | |
| 8,059,443 B2 | 11/2011 | McLaren et al. | |
| 8,060,843 B2 | 11/2011 | Wang et al. | |
| 8,114,757 B1 | 2/2012 | Or-Bach et al. | |
| 8,115,511 B2 | 2/2012 | Or-Bach | |
| 8,136,071 B2 | 3/2012 | Solomon | |
| 8,146,032 B2 | 3/2012 | Chen et al. | |
| 8,164,089 B2 | 4/2012 | Wu et al. | |
| 8,208,282 B2 | 6/2012 | Johnson et al. | |
| 8,218,377 B2 | 7/2012 | Tandon et al. | |
| 8,222,696 B2 | 7/2012 | Yamazaki et al. | |
| 8,230,375 B2 | 7/2012 | Madurawe | |
| 8,258,810 B2 | 9/2012 | Or-Bach et al. | |
| 8,298,875 B1 | 10/2012 | Or-Bach et al. | |
| 8,332,803 B1 | 12/2012 | Rahman | |
| 8,450,804 B2 | 5/2013 | Sekar et al. | |
| 8,576,000 B2 * | 11/2013 | Kim et al. | 327/565 |
| 8,683,416 B1 * | 3/2014 | Trivedi et al. | 716/130 |
| 8,701,073 B1 | 4/2014 | Fu et al. | |
| 8,803,206 B1 | 8/2014 | Or-Bach et al. | |
| 8,803,233 B2 | 8/2014 | Cheng et al. | |
| 2004/0036126 A1 | 2/2004 | Chau et al. | |
| 2004/0113207 A1 | 6/2004 | Hsu et al. | |
| 2004/0241958 A1 | 12/2004 | Guarini et al. | |
| 2005/0280061 A1 | 12/2005 | Lee | |
| 2006/0190889 A1 | 8/2006 | Cong et al. | |
| 2007/0040221 A1 | 2/2007 | Gossner et al. | |
| 2007/0147157 A1 | 6/2007 | Luo et al. | |
| 2007/0244676 A1 | 10/2007 | Shang et al. | |
| 2008/0276212 A1 * | 11/2008 | Albrecht | 716/10 |
| 2008/0283995 A1 | 11/2008 | Bucki et al. | |
| 2008/0291767 A1 | 11/2008 | Barnes et al. | |
| 2009/0174032 A1 | 7/2009 | Maejima et al. | |
| 2009/0302394 A1 | 12/2009 | Fujita | |
| 2010/0115477 A1 * | 5/2010 | Albrecht et al. | 716/2 |
| 2010/0140790 A1 | 6/2010 | Setiadi et al. | |
| 2010/0193770 A1 | 8/2010 | Bangsaruntip et al. | |
| 2010/0229142 A1 * | 9/2010 | Masleid et al. | 716/10 |
| 2010/0276662 A1 | 11/2010 | Colinge | |
| 2011/0049594 A1 | 3/2011 | Dyer et al. | |
| 2011/0053332 A1 | 3/2011 | Lee | |
| 2011/0059599 A1 | 3/2011 | Ward et al. | |
| 2011/0078222 A1 | 3/2011 | Wegener | |
| 2011/0084314 A1 | 4/2011 | Or-Bach et al. | |
| 2011/0121366 A1 | 5/2011 | Or-Bach et al. | |
| 2011/0215300 A1 | 9/2011 | Guo et al. | |
| 2011/0221502 A1 | 9/2011 | Meijer et al. | |
| 2011/0222332 A1 | 9/2011 | Liaw et al. | |
| 2011/0253982 A1 | 10/2011 | Wang et al. | |
| 2011/0272788 A1 | 11/2011 | Kim et al. | |
| 2011/0280076 A1 | 11/2011 | Samachisa et al. | |
| 2011/0298021 A1 | 12/2011 | Tada et al. | |
| 2012/0012972 A1 | 1/2012 | Takafuji et al. | |
| 2012/0056258 A1 | 3/2012 | Chen | |
| 2012/0129276 A1 | 5/2012 | Haensch et al. | |
| 2012/0129301 A1 | 5/2012 | Or-Bach et al. | |
| 2012/0152322 A1 | 6/2012 | Kribus et al. | |
| 2012/0171108 A1 | 7/2012 | Kim et al. | |
| 2012/0181508 A1 | 7/2012 | Chang et al. | |
| 2012/0187486 A1 | 7/2012 | Goto et al. | |
| 2012/0193621 A1 | 8/2012 | Or-Bach et al. | |
| 2012/0195136 A1 | 8/2012 | Yoko | |
| 2012/0217479 A1 | 8/2012 | Chang et al. | |
| 2012/0280231 A1 | 11/2012 | Ito et al. | |
| 2012/0286822 A1 | 11/2012 | Madurawe | |
| 2012/0304142 A1 | 11/2012 | Morimoto et al. | |
| 2012/0305893 A1 | 12/2012 | Colinge | |
| 2012/0313227 A1 | 12/2012 | Or-Bach et al. | |
| 2013/0026539 A1 | 1/2013 | Tang et al. | |
| 2013/0026608 A1 | 1/2013 | Radu | |
| 2013/0105897 A1 | 5/2013 | Bangsaruntip et al. | |
| 2013/0148402 A1 | 6/2013 | Chang et al. | |
| 2013/0240828 A1 | 9/2013 | Ota et al. | |
| 2013/0299771 A1 | 11/2013 | Youn et al. | |
| 2014/0008606 A1 | 1/2014 | Hussain et al. | |
| 2014/0035041 A1 | 2/2014 | Pillarisetty et al. | |
| 2014/0085959 A1 | 3/2014 | Saraswat et al. | |
| 2014/0097868 A1 | 4/2014 | Ngai | |
| 2014/0145347 A1 * | 5/2014 | Samadi et al. | 257/774 |
| 2014/0225218 A1 | 8/2014 | Du | |
| 2014/0225235 A1 | 8/2014 | Du | |
| 2014/0269022 A1 | 9/2014 | Xie et al. | |

FOREIGN PATENT DOCUMENTS

| | | |
|---|---|---|
| FR | 2973938 A1 | 10/2012 |
| JP | H06204810 A | 7/1994 |
| JP | 2001160612 A | 6/2001 |
| KR | 20010109790 A | 12/2001 |
| KR | 20080038535 A | 5/2008 |
| WO | 2011112300 A1 | 9/2011 |
| WO | 2012113898 A1 | 8/2012 |
| WO | 2013045985 A1 | 4/2013 |

OTHER PUBLICATIONS

Kim, Tak-Yung et al., "Clock Tree Syntheis for TSV-Based 3d IC designs", Oct. 2011, ACM, ACM Transactions on Design Automation of Electronic Systems, vol. 16, No. 4m Article 48, pp. 48:1-48:21.*
Freidman, Eby G., "Clock Distribution Networks in Synchronous Digital Integrated Circuits", 2001, IEEE, Proceedings of the IEEE, vol. 89, No. 5. pp. 665-692.*
Arunachalam, V. et al., "Low-Power Clock Distribution in a Multilayer Core #D Microprocessor", 2008, ACM, ACM 978-1-59593-999-9/08/05. pp. 429-434.*

(56) References Cited

OTHER PUBLICATIONS

Co-pending U.S. Appl. No. 13/784,915, filed Mar. 5, 2013.
Co-pending U.S. Appl. No. 13/788,224, filed Mar. 7, 2013.
Co-pending U.S. Appl. No. 13/792,384, filed Mar. 11, 2013.
Co-pending U.S. Appl. No. 13/792,592, filed Mar. 11, 2013.
Fujio I. et al., "Level Conversion for Dual-Supply Systems", IEEE Transactions on Very Large Scale Integration (VLSI) Systems, vol. 12, No. 2, Feb. 2004, pp. 185-195.
Mototsugu H. et al., "A Top-Down Low Power Design Technique Using Clustered Voltage Scaling with Variable Supply-Voltage Scheme", IEEE 1998 Custom Integrated Circuits Conference, pp. 495-498.
Xie J., et al., "CPDI: Cross-power-domain interface circuit design in monolithic 3D technology", Quality Electronic Design (ISQED), 2013 14th International Symposium ON, IEEE, Mar. 4, 2013, pp. 442-447, XP032418452, DOI: 10.1109/ISQED.2013.6523649 ISBN: 978-1-4673-4951-2 Section II. "Monolithic 3D Technology"; figures 1,3.
Arunachalam V., et al., "Low-power clock distribution in microprocessor", Proceedings of the 18th ACM Great Lakes Symposium on VLSI, GLSVLSI '08, Jan. 1, 2008, 3 pages, XP055106715, New York, USA DOI: 10.1145/1366110.1366212 ISBN: 978-1-59-593999-9 p. 429-p. 434.
Donno M., et al., "Power-aware clock tree planning", Proceedings of the 2004 International Symposium on Physical Design, ISPD '04, Jan. 1, 2004, 5 pages, XP055106989, New York, New York, USA DOI: 10.1145/981066.981097 ISBN: 978-1-58-113817-7 p. 140-p. 144.
Ganguly S., et al., "Clock distribution design and verification for PowerPC microprocessors", Computer-Aided Design, 1997, Digest of Technical Papers., 1997 IEEE/ACM International Conference on San Jose, CA, USA Nov. 9-13, 1997, Los Alamitos, CA, USA, IEEE Comput. Soc, US, Nov. 5, 1995, pp. 58-61, XP032372227, DOI: 10.1109/ICCAD.1995.479991 ISBN: 978-0-8186-8200-1 p. 58-p. 61.
International Search Report and Written Opinion—PCT/US2013/072380—ISA/EPO—Mar. 25, 2014.
Tsao C.W.A., et al., "UST/DME: a clock tree router for general skew constraints", Computer Aided Design, 2000, ICCAD-2000, IEEE/ACM International Conference ON, IEEE, Nov. 5, 2000, pp. 400-405, XP032402965, DOI: 10.1109/ICCAD.2000.896505 ISBN: 978-0-7803-6445-5 p. 400-p. 401.
Gong., et al., "Three Dimensional System Integration", Springer, IC Stacking Process and Design, Jan. 2011; IS8N 978-1-4419-0962-6; pp. 1-246.
Cong J. et al., "An automated design flow for 3d microarchitecture evaluation", Design Automation, 2006. Asia and South Pacific Conference On Jan. 24, 2006, Piscataway, NJ, USA, IEEE, Jan. 24, 2006, pp. 384-389, XP010899545, DOI: 10.1109/ASPDAC.2006.1594713, ISBN: 978-0-7803-9451-3, the whole document.
Jain A. et al., "Thermala electrical co-optimisation of floorplanning of three-dimensional integrated circuits under manufacturing and physical design constraints", IET Computers and Digital Techniques,. vol. 5, No. 3, May 9, 2011, pp. 169-178, XP006037867, ISSN: 1751-861X, DOI:10.1049/1ET-CDT:20090107, pp. 170-172.
Khan Q.A., et al., "A Single Supply Level Shifter for Multi-Voltage Systems," IEEE Proceedings of the 19th International Conference on VLSI Design (VLSID'06), 2006, 4 pages.
Kulkarni J., et al., "Capacitive-Coupling Wordline Boosting with Self-Induced VCC Collapse for Write VMIN Reduction in 22-nm 8T SRAM," IEEE International Solid-State Circuits Conference, 2012, pp. 234-236.
Lin S., et al., A New Family of Sequential Elements with Built-in Soft Error Tolerance for Dual-VDD Systems, IEEE Transactions on Very Large Scale Integration (VLSI) Systems, 2008, vol. 16 (10), pp. 1372-1384.
Loh, Gabriel H. et al., "Processor design in 3D die-stacking technologies," IEEE 2007 p. 31-48.
Minz J. et al., "Block-level 3-D Global Routing With an Application to 3-D Packaging", IEEE Transactions on Computer-Aided Design of Integrated Circuits and Systems, vol. 25, No. 10, Oct. 1, 2006, pp. 2248-2257, XP055137904, ISSN: 0278-0070,DOI:10.1109/TCAD.2005.860952 p. 2249-p. 2252.
Minz J, et al., "Channel and Pin Assignment for Three Dimensional Packaging Routing", May 24, 2004, pp. 1-6, XP055138056, Georgia Tech. Library. CERCS; GIT-CERCS-04-21, Retrieved from the Internet: URL:http://www.ceres.gatech.edu/tech-reports/tr2004/git-cercs-04-21.pdf.
Bobba S., et al., "Performance Analysis of 3-D Monolithic Integrated Circuits", 2010 IEEE International 3D Systems Integration Conference (3DIC), Nov. 1, 2010, pp. 1-4, XP55165273, DOI: 10.1109/3DIC.2010.5751465,ISBN: 978-1-45-770526-7.

\* cited by examiner

CLOCK DISTRIBUTION NETWORK FOR 3D INTEGRATED CIRCUIT

CLAIM OF PRIORITY UNDER 35 U.S.C. §119

The present Application for Patent claims priority to the following:
Provisional Application No. 61/730,755 entitled "CLOCK DISTRIBUTION NETWORK FOR 3D INTEGRATED CIRCUIT," filed Nov. 28, 2012, and assigned to the assignee hereof and hereby expressly incorporated by reference herein.
Provisional Application No. 61/730,767 entitled "DATA TRANSFER ACROSS POWER DOMAINS," filed Nov. 28, 2012, and assigned to the assignee hereof and hereby expressly incorporated by reference herein.

REFERENCE TO CO-PENDING APPLICATIONS FOR PATENT

The present Application for Patent is related to the following co-pending U.S. Patent Application(s):
"FLIP-FLOPS IN A MONOLITHIC THREE-DIMENSIONAL (3D) INTEGRATED CIRCUIT (IC) (3DIC) AND RELATED METHODS" by Yang Du, Jing Xie and Kambiz Samadi, filed Mar. 5, 2013, assigned application Ser. No. 13/784,915, assigned to the assignee hereof, and expressly incorporated by reference herein;
"MONOLITHIC THREE DIMENSIONAL INTEGRATION OF SEMICONDUCTOR INTEGRATED CIRCUITS" by Yang Du, filed Mar. 7, 2013, assigned application Ser. No. 13/788,224, assigned to the assignee hereof, and expressly incorporated by reference herein; and
"DATA TRANSFER ACROSS POWER DOMAINS" by Jing Xie and Yang Du, filed Mar. 11, 2013, assigned application Ser. No. 13/792,592, assigned to the assignee hereof, and expressly incorporated by reference herein.

FIELD OF DISCLOSURE

The disclosed embodiments are directed in general to the generation of clock signals in integrated circuits. More specifically, the disclosed embodiments are directed to efficient systems and methods for developing a scalable clock distribution network having high-speed, low skew and low power consumption.

BACKGROUND

In a synchronous integrated circuit (IC), clock signals are used to define a time reference for the movement of data within the circuit. The IC's clock distribution network (e.g., clock generation circuitry, wiring, buffering and registers) generates clock signals and distributes them from a particular point to all of the circuit elements that need them. The performance of a synchronous IC heavily depends on its clock distribution network design. The proper design of the clock distribution network helps ensure that critical timing requirements are satisfied and that clock skew is controlled. As IC's become larger, their clock distribution networks start to take up large portions of the design resources. Clock signals typically have the greatest fan-out and have to operate at the highest speeds of any control or data signal within the entire design. Clock power is typically more than one-third of total power consumption of a typical IC and is due to (i) clock tree wiring, (ii) clock tree buffers and (iii) clock tree sinks (e.g., flip-flops). Therefore, developing a scalable, high-speed, high-performance and low-power clock distribution network design is extremely difficult given the existing skew/slew constraints in large IC's.

3D IC's is an emerging technology that can provide higher-performance/lower-power designs. However, known 3D IC implementations tend to exacerbate clock distribution network design challenges because the clock signal has to reliably span across multiple tiers under tight skew/slew constraints. Hence, different tiers will have their own clock tree network. It is also impossible to meet skew/slew constraints across different clock networks spanning different tiers without degrading performance and power. To cope with this problem, asynchronous operation at the chip level is required, which then has its own disadvantages in various parameters including power consumption, speed and area footprint.

Accordingly, there is a need for systems and methods for developing clock distribution networks that are scalable, low-skew, high-speed and high-performance. There is a further need for systems and methods for developing clock distribution networks that are scalable, low-skew, high-speed and high-performance, within a 3D IC.

SUMMARY

Exemplary embodiments of the invention are directed to systems and method for designing a clock distribution network for an integrated circuit. The embodiments identify critical sources of clock skew, tightly control the timing of the clock and build that timing into the overall clock distribution network and integrated circuit design. The disclosed embodiments separate the clock distribution network (CDN), i.e., clock generation circuitry, wiring, buffering and registers, from the rest of the logic to improve the clock tree design and reduce the area footprint. In one embodiment, the CDN is separated to a separate tier of a 3D integrated circuit, and the CDN is connected to the logic tier(s) via high-density inter-tier vias. The embodiments are particularly advantageous for implementation with monolithic 3D integrated circuits.

The disclosed embodiments include a method of developing a clock distribution network for an integrated circuit, the steps comprising: capturing sources of clock skew including timing mismatches between clock sinks; synthesizing a higher level behavioral description of the integrated circuit and said sources of clock skew to generate a 2D layout comprising a clock distribution network and combinational logic; separating said clock distribution network from said combinational logic and locating said clock distribution network to a first area of the integrated circuit; and floorplanning said combinational logic of said first area. In a further embodiment, the integrated circuit comprises a multi-tier circuit; said first area comprises a first tier of said multi-tier circuit; and said combinational logic is located to a second tier of said multi-tier circuit.

The disclosed embodiments also include a clock distribution network of an integrated circuit comprising: the clock distribution network separated to a first area of said integrated circuit; combinational logic of said integrated circuit separated to a second area of said integrated circuits; and vias connecting said first area to said second area. In a further embodiment, the integrated circuit further comprises: the integrated circuit comprising a multi-tier circuit; said first area comprises a first tier of said multi-tier circuit; and said second area comprises a second tier of said multi-tier circuit.

BRIEF DESCRIPTION OF THE DRAWINGS

The accompanying drawings are presented to aid in the description of disclosed embodiments and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the terms "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
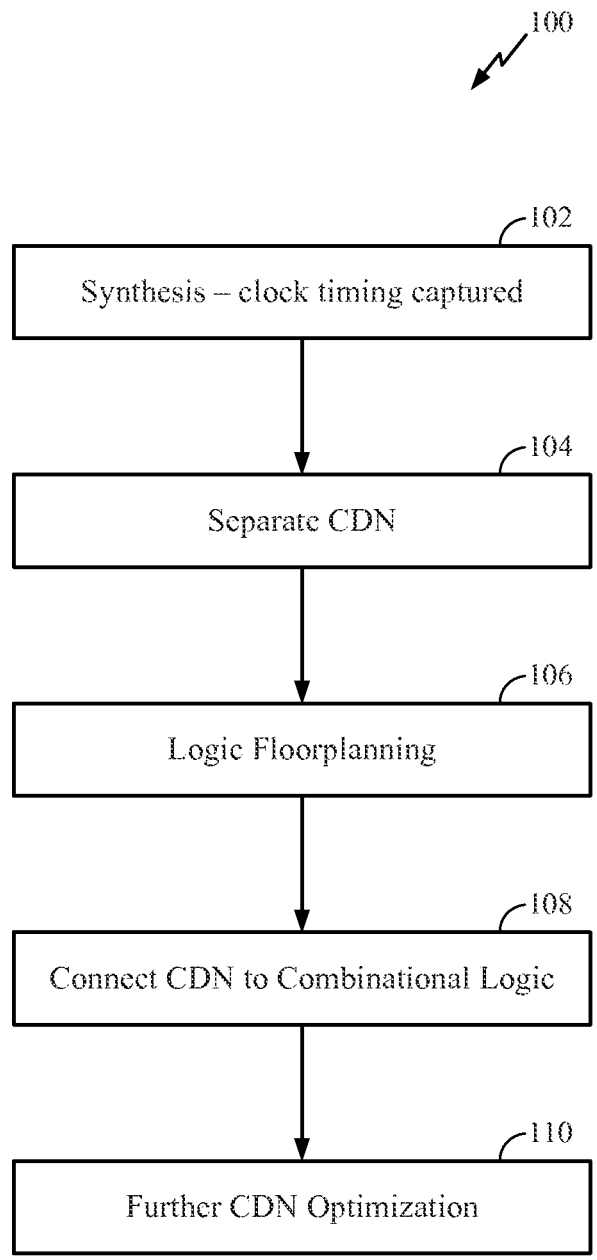
FIG. 1 is a high level flow diagram illustrating a methodology of the disclosed embodiments.

FIG. 1 is a high-level block diagram illustrating a design technique 100 of the disclosed embodiments. Design technique 100 develops a clock distribution network (CDN) that tightly controls the timing of the clock and builds that timing into the overall design. The IC may include digital components, analog components, or a combination of both. Reference throughout this disclosure to "logic" circuitry is intended to cover digital circuit components, analog circuit components and combinations of both. Design technique 100 at step 102 performs a synthesis operation, which takes a higher level behavioral description and synthesizes it to complex logic circuits that perform the described operations. The higher level behavioral description may be implemented as a Register Transfer Level (RTL) description that can be mapped to a library of gates. An RTL description describes a circuit's registers and the sequence of transfers between the registers. The synthesis performed at step 102 captures the clock distribution network timing information.

Step 104 separates the CDN (which includes clock generation circuitry, wiring, buffering and registers) from the remaining combinational logic developed at step 102. The separated CDN covers a smaller footprint due to separation of the CDN from the rest of the combinational logic. The smaller CDN results in smaller buffers, less wiring and reduced power. Separating the CDN reduces the complexity of the combinational logic for better routablility, reduced wire length, increased performance and a reduction in power consumption. Step 106 applies floorplanning techniques to the separated combinational logic. As described in more detail later in this disclosure, the floorplanning techniques may be 2D or 3D. At step 108, vias are mapped out to connect the clock sinks of the separated CDN to the corresponding logic of the separated combinational logic. The vias are preferably of a type that can be fabricated at high density in layers on a single semiconductor wafer. Step 110 applies further optimization techniques to the separated and floorplanned CDN until the desired overall performance parameters have been reached.

Figure 2:
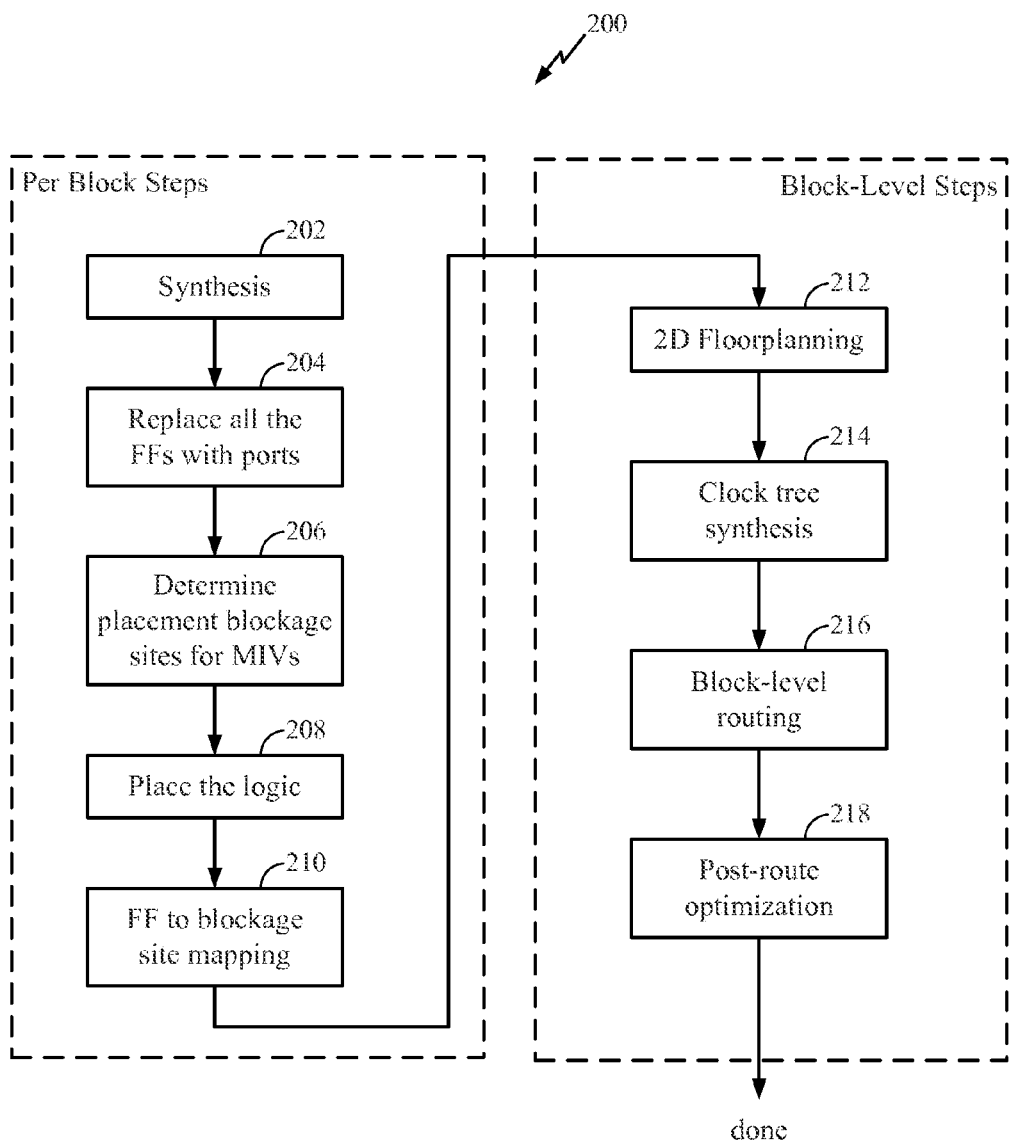
FIG. 2 is a more detailed example of the flow diagram of FIG. 1.

FIG. 2 is a flow diagram of a design technique 200 that is a more detailed implementation of the design technique 100 shown in FIG. 1. Design technique 200 may be advantageously applied to a 3D IC. Steps 202 to 210 are performed for the functional blocks and steps 212 to 218 are performed at the block level of the 3D IC. The synthesis operation performed at step 202 is essentially the same as the synthesis operation performed at step 102. Step 204 moves the clock sinks to a separate CDN area and replaces the clock sinks of the synthesized circuit with ports to provide an indication of where the clock sinks were actually located inside each functional block. The separate CDN area under design technique 200 is preferably a separate tier of a 3D IC dedicated to the CDN (clock generation circuitry, wiring, buffering, registers, etc.). Step 206 determines the placement blockage sites for the via connections between the CDN tier and the combinational logic. The vias connect where the clock sinks were located in the synthesized circuit. Because the vias are high density, the number of vias for a particular clock sink can correspond to the number of outputs from the clock sink. For example, where the clock sink is a flip-flop and the via is an inter-tier via, k inter-tier vias may be assigned for the particular flip-flop, with k representing the number of connections to the flip-flop output. Step 206 preferably inserts the blockages in a mesh-like fashion to increase the accessibility of the clock sinks across the entire block. Step 208 places the combinational logic on the logic tier, and step 210 maps each of the clock sinks to its associated blockage site.

Steps 212 to 218 are performed at the block level of the 3D IC. Step 212 applies floorplanning techniques to the logic tier. Because the disclosed embodiments are scalable, increasingly larger IC's and CDN's are accommodated by adding more CDN tiers. Thus, the floorplanning techniques at step 212 may be 2D (single CDN tier) or 3D (multiple CDN tiers). Steps 214 to 218 apply further optimization techniques to the separated and floorplanned logic and CDN until the desired overall performance parameters have been reached. Step 214 applies clock tree synthesis to the floorplanned CDN tier. The clock tree synthesis includes clock buffer insertion and utilizes the information on the placement of the blockage sites from step 206. Step 216 performs block-level routing, and step 218 performs post-route optimization. A conventional 2D post-route optimization engine may be used to accomplish step 218.

Thus, the above-described design techniques provide a number of benefits. At least one tier of the multi-tier design is primarily dedicated to housing the CDN, so there is no need to design a clock tree for each tier, thereby reducing design complexity. Also there are fewer metal layers under the design method of the disclosed embodiments, which saves cost compared with known 3D integrated circuit techniques. The smaller CDN footprint results in less clock power (e.g., approximately 30% power reduction), which results in less wiring and less buffering. The clock tree design that results from the methodology of the disclosed embodiments is cleaner because all the clock sinks and the CDN (which includes the clock buffers) reside on one tier. The separated CDN is significantly more robust against process variation (even more than 2D due to smaller footprint). Wirelength is reduced due to less logic complexity on the logic tier resulting in improved performance. The improved clock tree design results in improved timing closure. Design complexity is reduced because (i) existing 2D timing optimization engines can be used for embodiments where there are no 3D nets with respect to timing optimization, (ii) scan chain routing is simplified as there is no need to go through the logic tier. Where the existing sequential (non-memory) takes up approximately half the design area vs. combinational cells, there is easy balancing between tiers.

Figure 3:
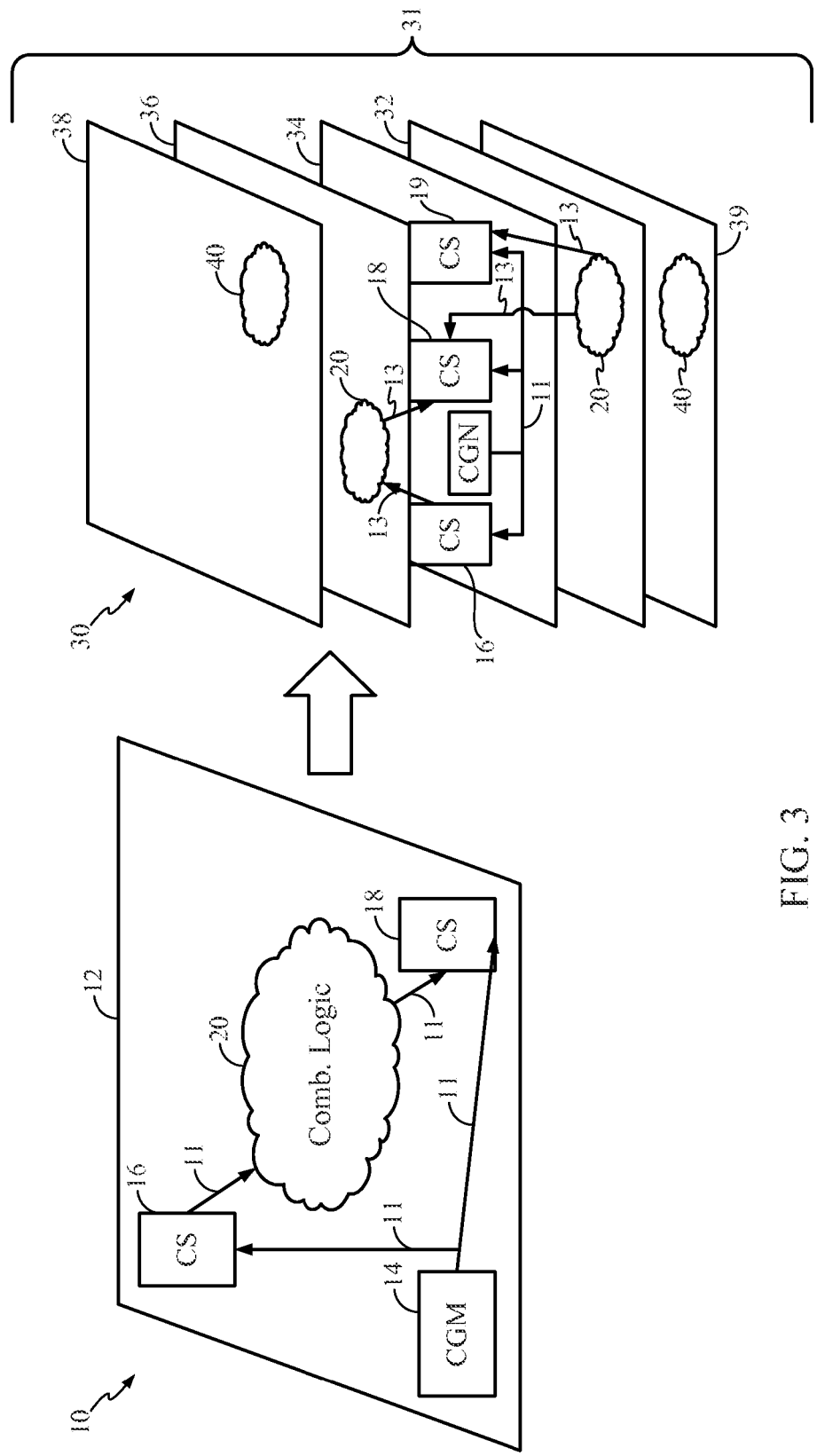
FIG. 3 is an example of a 2D timing arc and a 3D timing arc of the disclosed embodiments.
Figure 4:
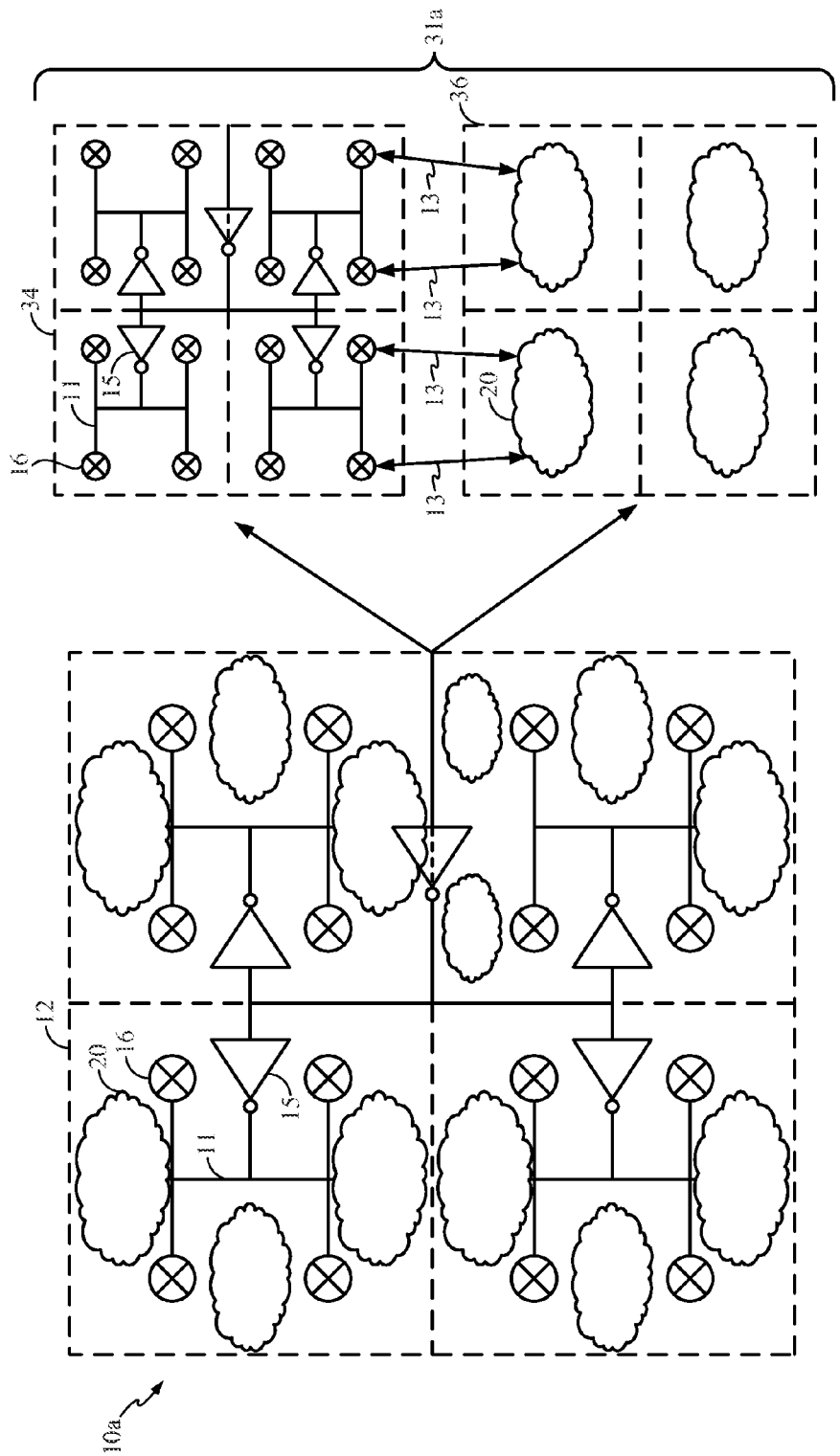
FIG. 4 is a more detailed example of the clock distribution network of FIG. 3.
Figure 5:
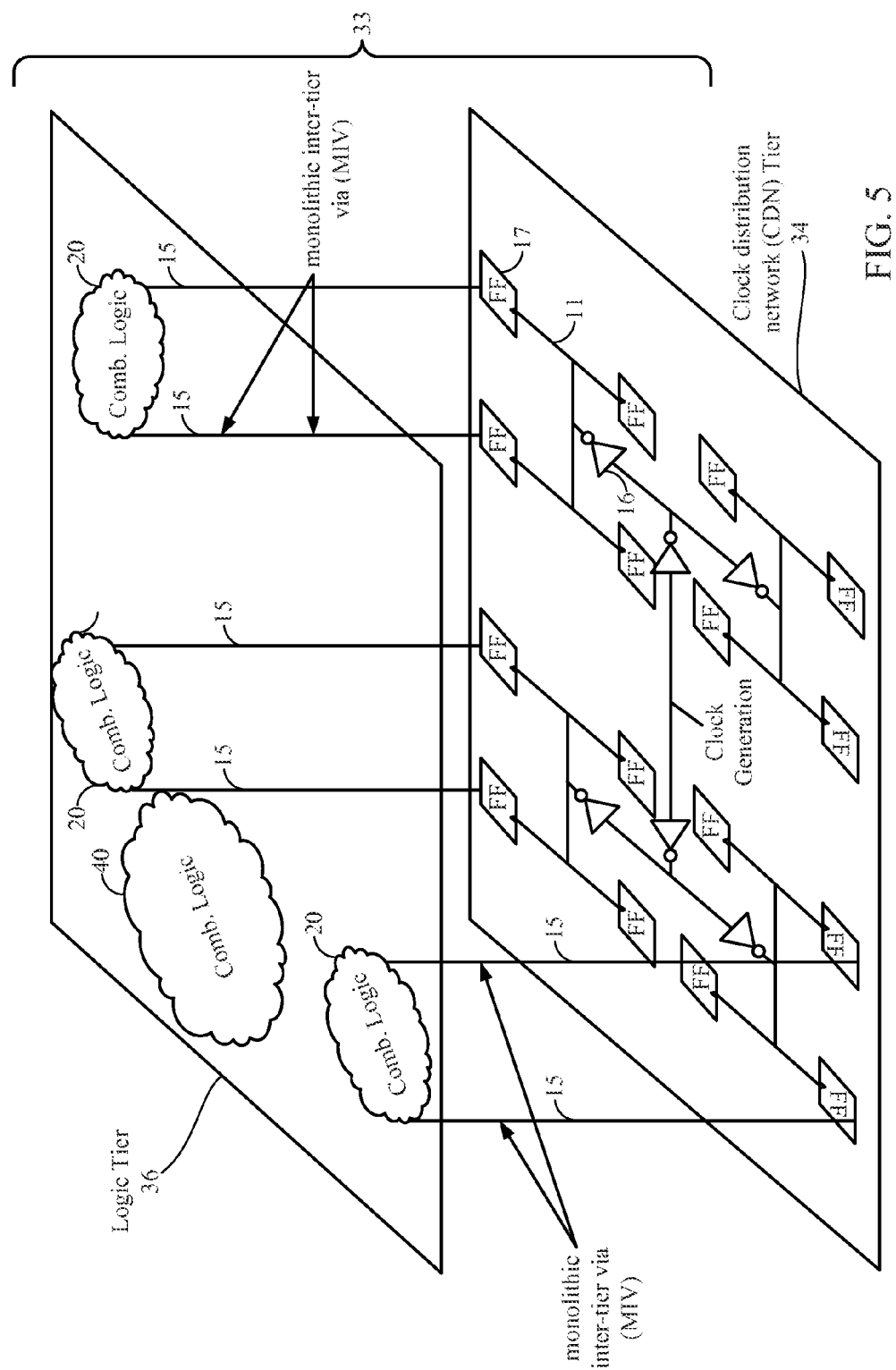
FIG. 5 is another more detailed example of the clock distribution network of FIG. 4.

FIGS. 3-5 illustrate general configurations of circuit layouts that can result from implementing the design techniques shown in FIGS. 1 and 2. FIG. 3 shows an example of a 2D timing arc 10 and a 3D timing arc 30. FIGS. 3-5 are general configurations broadly representing certain types of circuitry/elements (e.g., clock generation, wiring, combinational logic, clock sinks) but are not intended to convey a particular circuit example. Timing arc 10 includes clock generation module (CGM) 14, clock sinks (CS) 16, 18, wiring 11 and combinational logic 20, all in 2D and dispersed throughout a single tier 12. In practice, CGM 14 could be implemented as phase lock loop circuitry, and clock sinks 16, 18 could be implemented as flip-flop circuitry. In general, the timing arcs 10, 30 accurately capture the critical sources of clock skew, including for example design and/or delay mismatches from a so-called launch clock sink 16 to a so-called capture clock sink 18. Thus, the clock timing requirements are tightly controlled and built into the overall IC design.

Timing arc 30 illustrates the CDN (CGM 14, CS 16, 18, 19 and wiring 11) separated to a single tier 34 of a multi-tier IC 31. Combinational logic 20, which is timing critical, is placed after the CDN is separated. To the extent the CDN does not occupy an entire tier, some or all of the timing-critical combinational logic 20 may be placed on the same CDN tier. Thus, the timing-critical combinational logic 20 may be placed on CDN tier 34 if there is room after placement of the CDN, or on either tier 32, 36 that is adjacent CDN tier 34. The non-timing-critical combinational logic 40 may also be placed on CDN tier 34 if there is room after placement of the CDN and any timing-critical combinational logic 20, or on any other tier 32, 36, 38, 39 whether or not that tier is adjacent to a CDN tier. High density vias 13 are built into the multi-tier circuit 31 and connect CS 16, 18, 19 to timing-critical combinational logic 20.

Timing arc 30 further illustrates the scalability of the disclosed embodiments. The multi-tier circuit 31 is easily scalable for larger and larger IC's, as long as the CDN is separated to as many tiers as are needed to accommodate the size of the CDN. In the example shown in FIG. 3, the CDN (16, 18, 19, 14, 11) is on a single tier 34 but may be expanded to more CDN tiers (not shown) if the CDN size increases. Similarly, as the size of timing-critical combinational logic 20 increases, additional tiers may be added to accommodate the larger timing-critical logic as long as the additional tiers are either a CDN tier or adjacent to a CDN tier. Finally, as the size of non-timing-critical combinational logic 40 increases, additional tiers may be added to accommodate the larger non-timing-critical combinational logic.

FIG. 4 is a further illustration of the general configuration of circuit layouts that can result from implementing the design techniques shown in FIGS. 1 and 2. Similar to the timing arcs of FIG. 3, FIG. 4 shows an example of a 2D layout having the CDN and the corresponding logic, along with a multi-tier implementation of the 2D layout. FIG. 4 is a general configuration broadly representing certain types of circuitry/elements (e.g., clock generation, wiring, combinational logic, clock sinks) but is not intended to convey a particular circuit example 2D layout 10a includes clock generation module (CGM) 15, clock sinks (CS) 16, wiring 11 and combinational logic 20, all in 2D and dispersed throughout a single tier 12. In practice, CGM 15 could be implemented as phase lock loop circuitry, and clock sinks 16 could be implemented as flip-flop circuitry. Wiring 11 is shown for simplicity in an H-tree format, but may be implemented in a variety of different clock tree formats (e.g., grid, spines, etc.). In general, 2D layout 10 accurately captures the critical sources of clock skew, including for example design and/or delay mismatches between clock sinks 16. Thereby, the clock timing requirements are tightly controlled and built into the overall IC design.

FIG. 4 further illustrates the CDN (clock buffer 15, CS 16 and wiring 11) separated to a single tier 34 of a multi-tier IC 31a. Combinational logic 20, which is timing critical, is placed after the CDN is separated. To the extent the CDN does not occupy an entire tier, some or all of the timing-critical combinational logic 20 may be placed on the same CDN tier. Thus, the timing-critical combinational logic 20 may be placed on CDN tier 34 if there is room after placement of the CDN, or on any tier (e.g., tier 36) adjacent to CDN tier 34. The non-timing-critical combinational logic 40 (shown in FIG. 3) may also be placed on CDN tier 34 if there is room after placement of the CDN and any timing-critical combinational logic 20, or on any other tier 32, 36, 38 (shown in FIG. 3) whether or not that tier is adjacent to a CDN tier. High density vias 13 are built into the multi-tier circuit 31a and connect CS 16 to timing-critical combinational logic 20.

FIG. 5 is a more detailed example of the multi-tier circuit 31a shown in FIGS. 3 and 4. The multi-tier circuit of FIG. 5 is shown as a monolithic 3D IC 33 having at least a CDN tier 34 and a logic tier 36. The clocks sinks of FIG. 5 are implemented as flip-flop (FF) circuitry 17. The high density vias 13 of FIGS. 3 and 4 are implemented and shown in FIG. 5 as monolithic inter-tier vias (WV) 15. In monolithic 3D IC's, electronic components and their connections (wiring) are built in layers on a single semiconductor wafer, which is then diced into 3D ICs. There is only one substrate, hence no need for aligning or through-silicon vias.

Thus, the above-described embodiments separate the clock distribution network from the rest of the logic. Preferably, the clock distribution network is implemented using monolithic 3D integration technology. Thus, a single tier will host the clock subsystem and the other tier(s) will hold the remaining combinational logic. The clock tier under the present disclosure will include the clock generation circuitry (i.e., PLLs or DLLs), clock distribution wiring (H-tree, grid, spines, etc.) and a majority (e.g., 75%) of the sequential elements of the design. The clock tier will contain the widest metal lines for better clock distribution control. The clock distribution network includes a smaller footprint due to separation of the clock distribution from the rest of the logic. The smaller clock network results in smaller buffers, less wiring and reduced power. Separating the clock distribution reduces the complexity of the logic tier for better routablility, reduced wire length, increased performance and a reduction in power consumption. High density inter-tier vias provided by the monolithic 3D integration are used to connect the clock sinks on the clock tier to the corresponding logic on the logic tier.

While the foregoing disclosure and illustrations show embodiments of the invention, it should be noted that various changes and modifications could be made herein without departing from the scope of the invention as defined by the appended claims. For example, the functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

Those of skill in the relevant arts will also appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. Accordingly, an embodiment of the invention can include a computer readable media embodying a method for performing the disclosed and claimed embodiment. Accordingly, the invention is not limited to illustrated examples and any means for performing the functionality described herein are included in embodiments of the invention.

What is claimed is:

1. A non-transitory computer readable medium having instructions stored thereon that when executed by a computer performs a method of developing a clock distribution network for an integrated circuit, the method comprising:
    capturing sources of clock skew including timing mismatches between clock sinks;
    moving the clock sinks to a clock distribution network;
    synthesizing a behavioral description of the integrated circuit and said sources of clock skew to generate a 2D layout comprising the clock distribution network and combinational logic;
    separating said clock distribution network from said combinational logic and locating said clock distribution network to a first area of the integrated circuit;
    determining vias to provide via connections between the clock distribution network and the combinational logic, where the via connections are where the clock sinks were located before the step of moving the clock sinks; and
    floorplanning said combinational logic of said first area.

2. The non-transitory computer readable medium of claim 1, the method further comprising the step of applying further optimization to said clock distribution network of said first area.

3. The non-transitory computer readable medium of claim 2, the method wherein said further optimization comprises clock tree synthesis.

4. The non-transitory computer readable medium of claim 3, the method wherein said further optimization comprises block-level routing.

5. The non-transitory computer readable medium of claim 4, the method wherein said further optimization comprises post-route optimization.

6. The non-transitory computer readable medium of claim 2, the method wherein:
    the integrated circuit comprises a multi-tier circuit;
    said first area comprises a first tier of said multi-tier circuit; and
    said combinational logic is located to a second tier of said multi-tier circuit.

7. The non-transitory computer readable medium of claim 6, the method wherein said first tier is adjacent said second tier.

8. The non-transitory computer readable medium of claim 6, the method wherein:
    said combinational logic further comprises non-timing critical combinational logic; and
    said non-timing critical combinational logic is located to a third tier of said multi-tier circuit.

9. The non-transitory computer readable medium of claim 8, wherein said third tier is not adjacent said first tier.

10. The non-transitory computer readable medium of claim 6, the method wherein:
    said timing-critical combinational logic is further located to a fourth tier of said multi-tier circuit; and
    said fourth tier is adjacent said first tier.

11. The non-transitory computer readable medium of claim 10, the method wherein:
    said combinational logic comprises further non-timing critical combinational logic; and
    said non-timing critical combinational logic is located to a fifth tier of said multi-tier circuit.

12. The non-transitory computer readable medium of claim 11, the method wherein said fifth tier is not adjacent said first tier.

13. The non-transitory computer readable medium of claim 1, the method wherein said vias comprise inter-tier vias.

14. The non-transitory computer readable medium of claim 13, the method wherein said inter-tier vias comprise high-density.

15. The non-transitory computer readable medium of claim 1, the integrated circuit comprising:
the clock distribution network separated to a first tier of said integrated circuit; and
the combinational logic separated to a second tier of said integrated circuit;
wherein the vias connect said first tier to said second tier.

16. The non-transitory computer readable medium of claim 15 wherein:
the integrated circuit comprises a multi-tier circuit.

17. The non-transitory computer readable medium of claim 16 wherein said first tier is adjacent said second tier.

18. The non-transitory computer readable medium of claim 16 wherein:
said integrated circuit further comprises non-timing critical combinational logic; said non-timing critical combinational logic is separated to a third tier of said integrated circuit.

19. The non-transitory computer readable medium of claim 18 wherein said third tier is not adjacent said first tier.

20. The non-transitory computer readable medium of claim 16 wherein:
said combinational logic is further located to a fourth tier of said multi-tier circuit; and
said fourth tier is adjacent said first tier.

21. The non-transitory computer readable medium of claim 20 wherein:
said integrated circuit further comprises non-timing critical combinational logic; and
said non-timing critical combinational logic is located to a fifth tier of said multi-tier circuit.

22. The non-transitory computer readable medium of claim 21 wherein said fifth tier is not adjacent said first tier.

23. The non-transitory computer readable medium of claim 15 wherein said vias comprise inter-tier vias.

24. The non-transitory computer readable medium of claim 23 wherein said inter-tier vias comprise high-density vias.

* * * * *